(12) United States Patent  
Binnard

(10) Patent No.: US 7,429,845 B2  
(45) Date of Patent: Sep. 30, 2008

(54) SYSTEM AND METHOD FOR CONTROLLING A STAGE ASSEMBLY

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 362 days.

(21) Appl. No.: 11/107,231

(22) Filed: Apr. 16, 2005

(65) Prior Publication Data

US 2006/0232140 A1    Oct. 19, 2006

(51) Int. Cl.
*B64C 17/06*    (2006.01)

(52) U.S. Cl. .............. 318/649; 355/53; 355/77; 318/567; 318/38; 318/53

(58) Field of Classification Search ............... 318/649
See application file for complete search history.

(56) References Cited

U.S. PATENT DOCUMENTS

2004/0257548 A1* 12/2004 Dams et al. ............ 355/53

* cited by examiner

*Primary Examiner*—Lincoln Donovan  
*Assistant Examiner*—Michael Brandt  
(74) *Attorney, Agent, or Firm*—Steven G. Roeder; James P. Broder

(57) ABSTRACT

A stage assembly (220) that moves a work piece (200) a movement step (257) includes a first stage (238), a first mover assembly (242), a second stage (240), and a second mover assembly (244). The first mover assembly (242) moves the first stage (238) with a first acceleration profile (366) during the movement step (257) and the second mover assembly (244) moves the second stage (240) with a second acceleration profile (368) during the movement step (257) that is different than the first acceleration profile. For example, the second mover assembly (244) moves the second stage (240) during the movement step (257) with a higher maximum acceleration than the first mover assembly (242) moves the first stage (238) during the movement step (257). Further, the second mover assembly (244) moves the second stage (240) during the movement step (257) with a higher average acceleration than the first mover assembly (242) moves the first stage (238) during the movement step (257).

35 Claims, 9 Drawing Sheets

SYSTEM AND METHOD FOR CONTROLLING A STAGE ASSEMBLY

BACKGROUND

Exposure apparatuses for semiconductor processing are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system.

One type of stage assembly includes a coarse stage, a coarse stage mover assembly, a fine stage that retains the wafer or the reticle, and a fine stage mover assembly that moves the fine stage and the wafer or the reticle. More specifically, the control system directs current to the fine stage mover assembly to move the wafer or reticle, and the control system concurrently directs current to the coarse stage mover assembly to move the coarse stage to precisely follow the movement of the fine stage. With this design, the fine stage mover assembly moves the fine stage, and the coarse stage mover assembly moves the coarse stage at the same time and the same rate as the fine stage is moved.

Generally, it is desirable to move the fine stage with as high acceleration as possible to improve system throughput. The coarse stage is typically much heavier than the fine stage. Accordingly, the motor force and heat generated is determined primarily by the acceleration of the coarse stage. Unfortunately, existing high throughput stage assemblies can consume excessive amounts of power and generate excessive amounts of heat.

SUMMARY

The present invention is directed a stage assembly that moves a work piece along a first axis during a movement step. The stage assembly includes a first stage, a first mover assembly, a second stage, and a second mover assembly. In certain embodiments, the first mover assembly moves the first stage with a first acceleration profile during the movement step, and the second mover assembly moves the second stage with a second acceleration profile during the movement step that is different than the first acceleration profile.

For example, during the movement step, the second mover assembly can move the second stage with a higher maximum acceleration and/or a higher average acceleration than the first mover assembly moves the first stage.

In one embodiment, the second mover assembly starts movement of the second stage at the same time that the first mover assembly starts movement of the first stage during the movement step. Further, the second mover assembly stops movement of the second stage before the first mover assembly stops movement of the first stage during the movement step. In another embodiment, the first mover assembly starts movement of the first stage before the second mover assembly starts movement of the second stage during the movement step.

Further, the present invention is also directed to a method for moving a stage, a method for manufacturing an exposure apparatus, and a method for manufacturing an object or a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
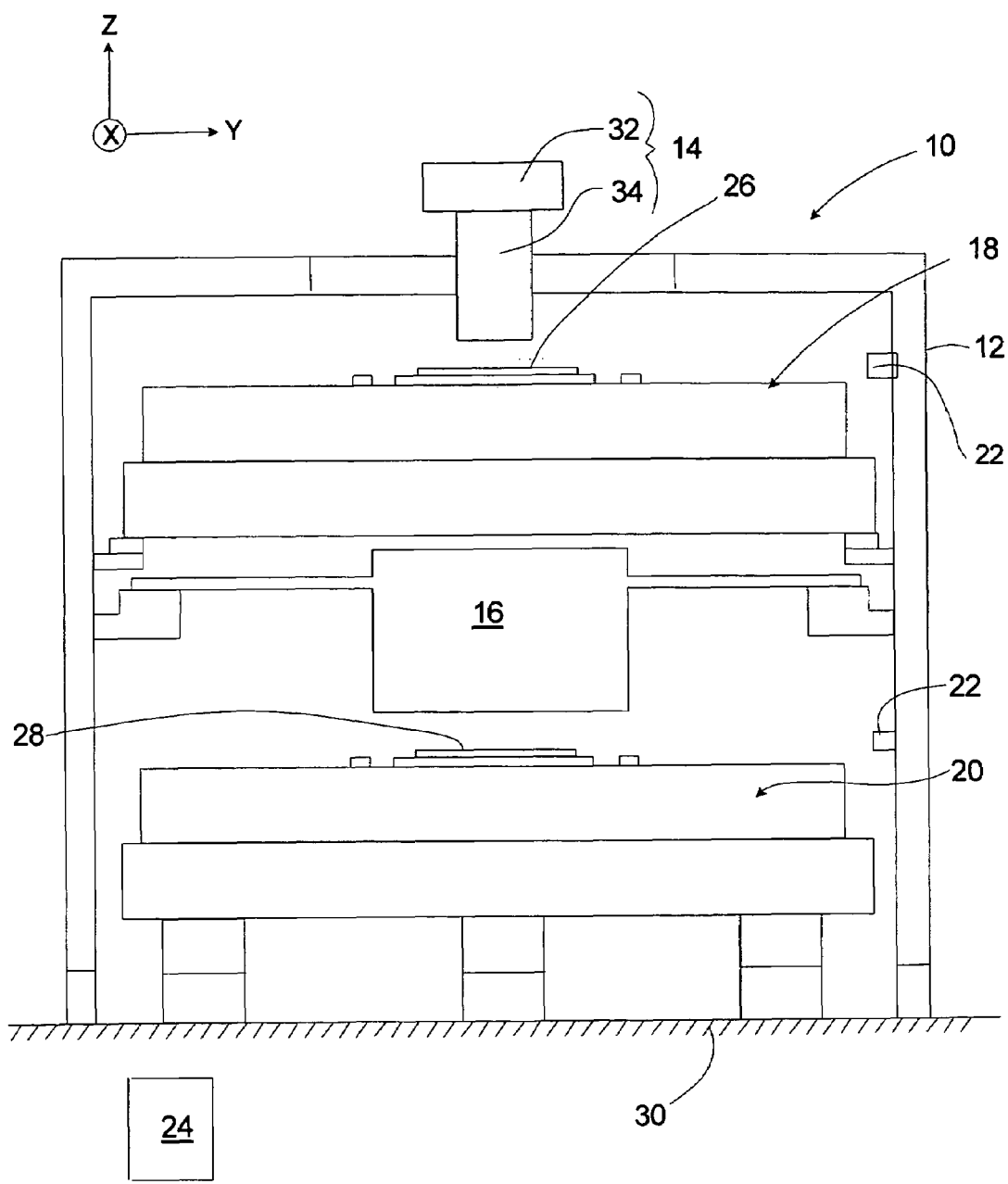
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10. In certain embodiments, the control system 24 controls one or both of the stage assemblies 18, 20 in a fashion that reduces power consumption and generated heat, without changing the throughput of the respective stage assembly 18, 20.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis of the optical assembly 16 by the reticle stage assembly 18 and the wafer 28 is moved perpendicularly to the optical axis of the optical assembly 16 by the wafer stage assembly 20. Scanning of the reticle 26 and the wafer 28 occurs while the reticle 26 and the wafer 28 are moving synchronously.

Alternatively, the exposure apparatus 10 can be a step-and-repeat type photolithography system that exposes the reticle 26 while the reticle 26 and the wafer 28 are stationary. In the step and repeat process, the wafer 28 is in a constant position relative to the reticle 26 and the optical assembly 16 during the exposure of an individual field. Subsequently, between consecutive exposure steps, the wafer 28 is consecutively moved with the wafer stage assembly 20 perpendicularly to the optical axis of the optical assembly 16 so that the next field of the wafer 28 is brought into position relative to the optical assembly 16 and the reticle 26 for exposure. Following this process, the images on the reticle 26 are sequentially exposed onto the fields of the wafer 28, and then the next field of the wafer 28 is brought into position relative to the optical assembly 16 and the reticle 26.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam illuminates selectively different portions of the reticle 26 and exposes the wafer 28. In FIG. 1, the illumination source 32 is illustrated as being supported above the reticle stage assembly 18. Typically, however, the illumination source 32 is secured to one of the sides of the apparatus frame 12 and the energy beam from the illumination source 32 is directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm) or a $F_2$ laser (157 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668, 672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 28. Somewhat similarly, the wafer stage assembly 20 holds and positions the wafer 28 with respect to the projected image of the illuminated portions of the reticle 26.

Further, in photolithography systems, when linear motors (see U.S. Pat. No. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528, 100 and 5,874,820 and Japanese Patent Application Disclosure No. 8-330224 are incorporated herein by reference.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage mover assemblies 18, 20 to precisely position the reticle 26 and the wafer 28. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2A:
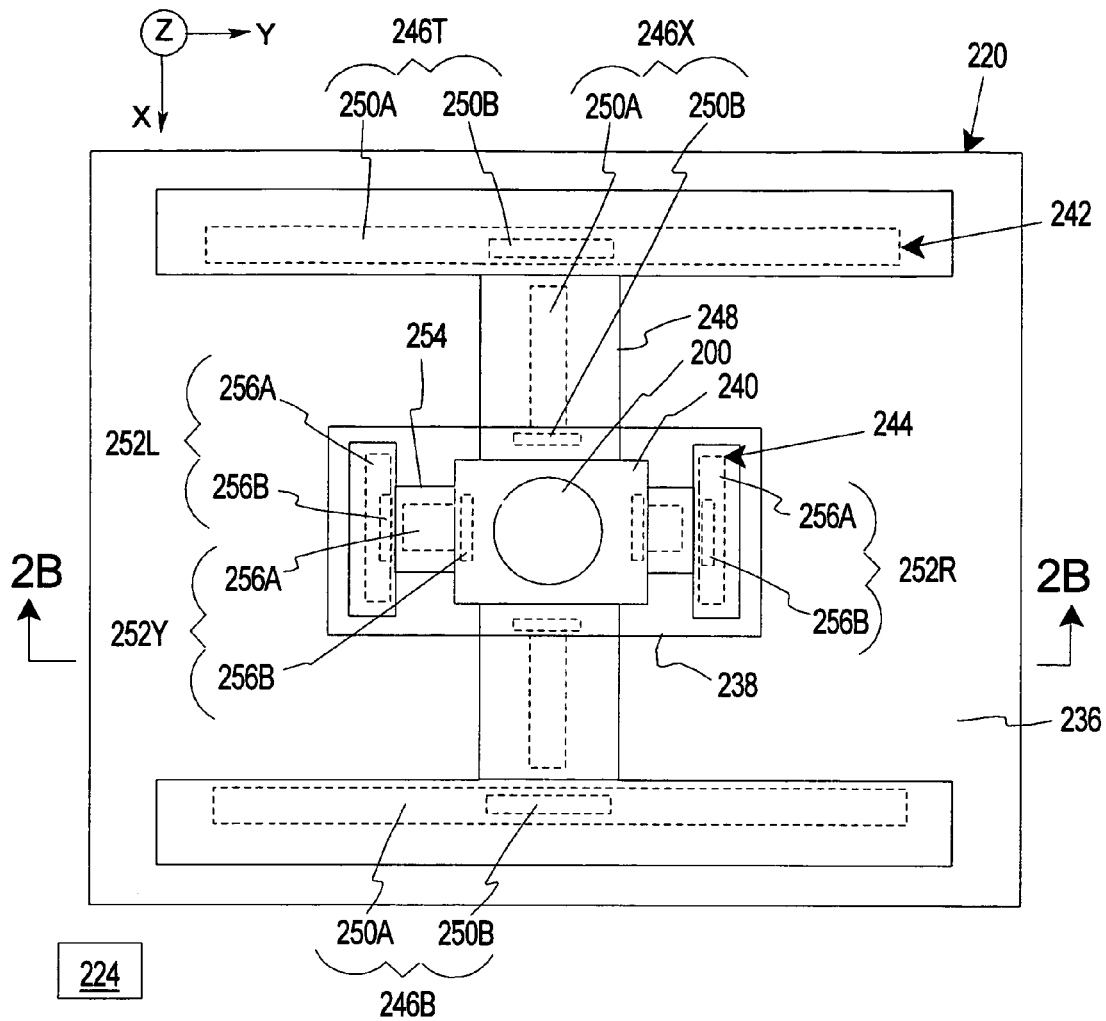
FIG. 2A is a simplified top plan view of one embodiment of a stage assembly having features of the present invention.

FIG. 2A is a simplified top view of a control system 224 and one embodiment of a stage assembly 220 that is used to position a work piece 200. For example, the stage assembly 220 can be used as the wafer stage assembly 20 in the exposure apparatus 10 of FIG. 1. In this embodiment, the stage assembly 220 would position the wafer 28 (illustrated in FIG. 1) during manufacturing of the semiconductor wafer 28. Alternatively, the stage assembly 220 can be used to move other types of work pieces 200 during manufacturing and/or inspection, to move a device under an electron microscope (not shown), or to move a device during a precision measurement operation (not shown). For example, the stage assembly 220 could be designed to function as the reticle stage assembly 18.

In this embodiment, the stage assembly 220 includes a stage base 236, a first stage 238, a second stage 240, a first mover assembly 242, and a second mover assembly 244. The size, shape, and design of each these components can be varied. The control system 224 precisely controls the mover assemblies 242, 244 to precisely position the work piece 200.

In FIG. 2A, the stage base 236 supports some of the components of the stage assembly 220 and guides the movement of the first stage 238 along the X axis, along the Y axis and about the Z axis. In this embodiment, the stage base 236 is generally rectangular shaped.

The first stage 238 facilitates relatively large movements of the second stage 240 and is commonly referred to as the coarse stage. In one embodiment, the first stage 238 is generally rectangular shaped and supports the second stage 240 and the second mover assembly 244. In FIG. 2A, a bearing (not shown) supports the first stage 238 above the stage base 236 and allows the first stage 238 to move relative to the stage base 236 along the X axis, along the Y axis and about the Z axis.

The second stage 240 retains the work piece 200 and is commonly referred to as the fine stage. In one embodiment, the second stage 240 is generally rectangular shaped and includes a chuck (not shown) for holding the work piece 200.

The first mover assembly 242 moves the first stage 238 and a portion of the second mover assembly 244 relative to the stage base 236. In the embodiment illustrated in FIG. 2A, the first mover assembly 242 moves the first stage 238 with three degrees of freedom, namely, along the X axis, along the Y axis and about the Z axis. Alternatively, for example, the first mover assembly 242 could be designed to move the first stage 238 with less than three degrees of freedom, or more than three degrees of freedom. The first mover assembly 242 can include one or more movers.

In FIG. 2A, the first mover assembly 242 includes a top Y first mover 246T (illustrated in phantom), a bottom Y first mover 246B (illustrated in phantom), an X first mover 246X (illustrated in phantom), and a first guide bar 248.

The Y first movers 246T, 246B move the first guide bar 248, and the first stage 238 along the Y axis and with a limited range of motion about the Z axis, and the X first mover 246X moves the first stage 238 along the X axis relative to the first guide bar 248.

The design of each mover 246T, 246B, 246X can be varied to suit the movement requirements of the first mover assembly 242. In the embodiment illustrated in FIG. 2A, each of the movers 246T, 246B, 246X includes a first mover component 250A and a second mover component 250B that interacts with the first mover component 250A. In this embodiment, each of the movers 246T, 246B, 246X is a linear motor and one of the mover components 250A, 250B is a magnet array that includes one or more magnets and one of the mover components 250B, 250A is a conductor array that includes one or more coils. In FIG. 2A, the first mover component 250A of each Y first mover 246T, 246B is secured to the stage base 236 and the second mover component 250B of each Y first mover 246T, 246B is secured to the guide bar 248. Further, the first mover component 250A of the X first mover 246X is secured to the guide bar 248 and the second mover component 250B of the X first mover 246X is secured to the first stage 238.

Alternatively, one or more of the first movers 246T, 246B, 246X can be another type of motor, such as a rotary motors, a voice coil motor, an electromagnetic mover, a planar motor, or some other force mover.

The maximum stroke of each of the first movers 246T, 246B, 246X will depend upon the type of mover utilized and the design of the rest of the stage assembly 220. In non-exclusive examples, the maximum stroke of each of the first movers 246T, 246B, 246X is at least approximately 10, 20, 50, 100, 200, 400, 500, 750, or 1000 mm.

The first guide bar 248 guides the movement of the first stage 238 along the X axis. In FIG. 2A, the first guide bar 248 is somewhat rectangular beam shaped. A bearing (not shown) maintains the first guide bar 248 spaced apart along the Z axis relative to the stage base 236 and allows for motion of the first guide bar 248 along the Y axis and about the Z axis relative to the stage base 236.

The second mover assembly 244 moves and positions the second stage 240 and the work piece 200. In the embodiment illustrated in FIG. 2A, the second mover assembly 244 moves the second stage 240 with three degrees of freedom, namely, along the X axis, along the Y axis and about the Z axis, and a bearing (not shown) supports the second stage 240 above the first stage 238 and allows the second stage 240 to move relative to the first stage 238 along the X axis, along the Y axis and about the Z axis. The second mover assembly 244 can include one or more movers.

Alternatively, for example, the second mover assembly 244 could be designed to move the second stage 240 with less than three degrees of freedom, or more than three degrees of freedom. If the second stage 240 is moved with more than three degrees of freedom relative to the first stage 238, the second mover assembly 244 typically includes one or more movers that support the second stage 240 relative to the first stage 238 along the Z axis.

In FIG. 2A, the second mover assembly 244 includes a left X second mover 252L (illustrated in phantom), a right X second mover 252R (illustrated in phantom), a Y second mover 252Y (illustrated in phantom), and a second guide bar 254. The X second movers 252L, 252R move the second guide bar 254, and the second stage 240 along the X axis and with a limited range of motion about the Z axis, and the Y second mover 252Y moves the second stage 240 along the Y axis relative to the second guide bar 254.

The design of each mover 252L, 252R, 252Y can be varied to suit the movement requirements of the second mover assembly 244. In the embodiment illustrated in FIG. 2A, each of the movers 252L, 252R, 252Y includes a first mover component 256A and a second mover component 256B that interacts with the first mover component 256A. In this embodiment, each of the movers 252L, 252R, 252Y is a linear motor and one of the mover components 256A, 256B is a magnet array that includes one or more magnets and one of the mover components 256B, 256A is a conductor array that includes one or more coils. In FIG. 2A, the first mover component 256A of each X second mover 252L, 252R is secured to the first stage 238 and the second mover component 256B of each X second mover 252L, 252R is secured to the second guide bar 254. Further, the first mover component 256A of the Y second mover 252Y is secured to the second guide bar 254 and the second mover component 256B of the Y second mover 252Y is secured to the second stage 240.

Alternatively, one or more of the movers 252L, 252R, 252Y can be another type of motor, such as a rotary motors, a voice coil motor, an electromagnetic mover, a planar motor, or some other force mover.

The maximum stroke of each of the second movers 252L, 252R, 252X will depend upon the type of mover utilized and the design of the rest of the stage assembly 220. In alternative, non-exclusive examples, the maximum stroke of each of the second movers 252L, 252R, 252X is at least approximately 1, 2, 5, 7, 10, or 20 millimeters.

The second guide bar 254 guides the movement of the second stage 240 along the Y axis. In FIG. 2A, the second guide bar 254 is somewhat rectangular beam shaped. A bearing (not shown) maintains the second guide bar 254 spaced apart along the Z axis relative to the first stage 238 and allows for motion of the second guide bar 254 along the Y axis and about the Z axis relative to the first stage 238.

In FIG. 2A, each of the bearing, for example, can be a vacuum preload type fluid bearing, a magnetic type bearing or a roller type assembly.

Figure 2B:
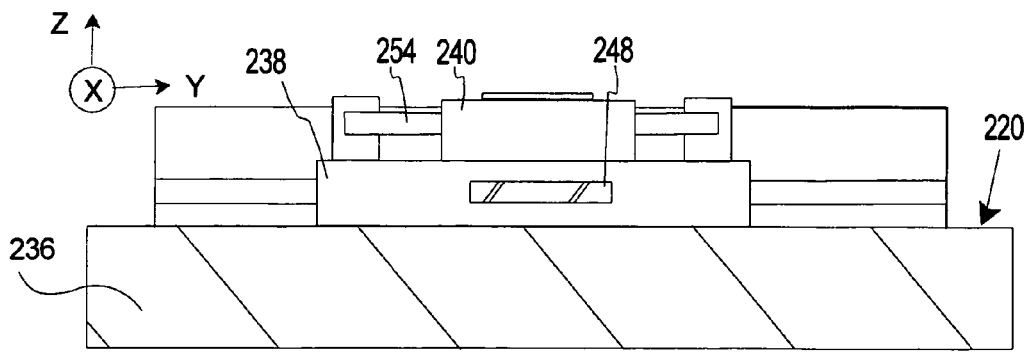
FIG. 2B is a simplified cut-away view taken on line 2B-2B of FIG. 2A.

FIG. 2B is a cut-away view of the stage assembly 220. FIG. 2B illustrates that the first guide bar 248 extends through an aperture in the first stage 238. Further, the first stage 238 is maintained apart from the first guide bar 248 with opposed bearings (not shown) that allow for motion of the first stage 238 along the X axis relative to the first guide bar 248, while inhibiting motion of the first stage 238 relative to the first guide bar 248 along the Y axis and about the Z axis.

Similarly, the second guide bar 254 extends through an aperture in the second stage 240. Further, the second stage 240 is maintained apart from the second guide bar 254 with opposed bearings (not shown) that allow for motion of the second stage 240 along the Y axis relative to the second guide bar 254, while inhibiting motion of the second stage 240 relative to the second guide bar 254 along the X axis and about the Z axis.

Figure 2C:
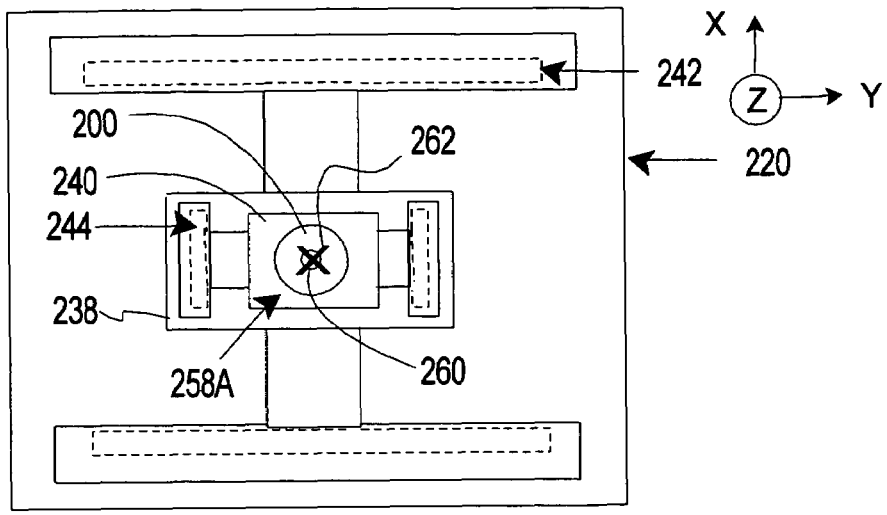
FIGS. 2C-2E illustrate the stage assembly at three alternative positions during a movement step.
Figure 2D:
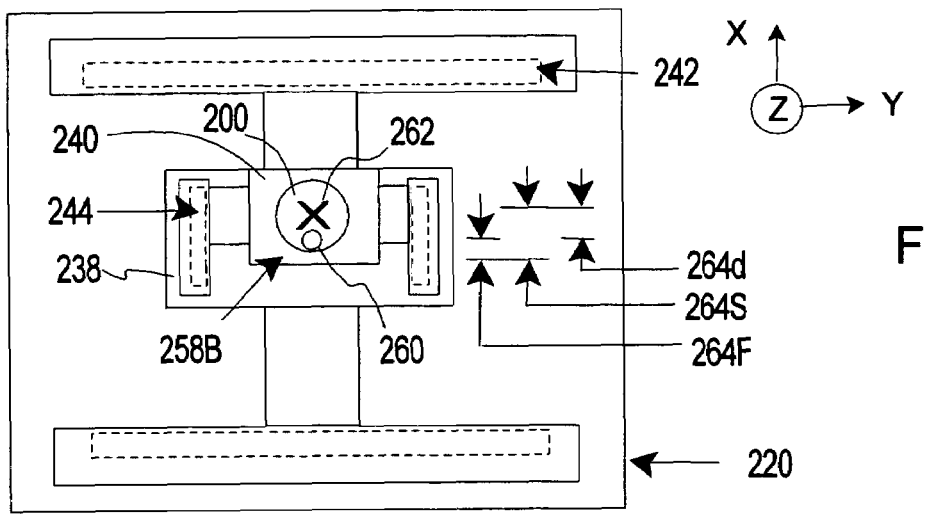
Figure 2E:
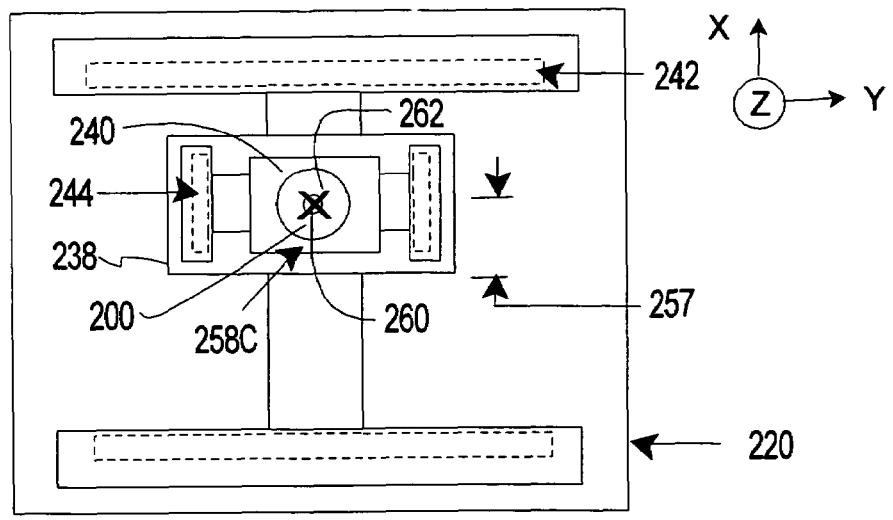

FIGS. 2C-2E illustrate the stage assembly 220 at three alternative positions during one, non-exclusive example of a movement step 257 (illustrated in FIG. 2E) of the work piece 200. The direction and size of the movement step 257 will depend upon the movement requirements of the work piece 200. In this embodiment, the movement step 257 is along the X axis. Alternatively, for example, the movement step 257 can be (i) along the Y axis, (ii) about the Z axis, (iii) or any combination of along the X axis, along the Y axis and about the Z axis. For example, the movement step 257 can be between approximately 0 and 30 mm. However, the movement step 257 can be larger. In alternative, non-exclusive examples, the movement step 257 is approximately 10, 20, 25, 26, 30, 40, 50, 60, 70, 80, 90, 100, 150, or 200 mm.

In certain embodiments, the control system 224 directs current to the mover assemblies 242, 244 so that the stages 238, 240 are moved at a different rate during the movement step 257.

FIG. 2C illustrates the stage assembly 220 with the work piece 200 in an initial position 258A before movement begins, with both stages 238, 240 motionless. A first reference point 260 of the first stage 238 is represented as a circle and a second reference point 262 of the second stage 240 is represented as an X. In the initial position 258A, the second reference point 262 is centered on the first reference point 260. Further, both reference points 260, 262 are centered with the work piece 200.

FIG. 2D illustrates the stage assembly 220 with the work piece 200 in an intermediate position 258B during the movement step 257, with both stages 238, 240 being moved. At this time during the movement step 257, the control system 224 is directing current to the mover assemblies 242, 244 so that the second stage 240 is moving faster than the first stage 238, the second stage 240 is near the maximum stroke of the second mover assembly 244 along the X axis, the first stage 238 has been moved a first intermediate distance 264F, the second stage 240 has been moved a second intermediate distance 264S, and the second reference point 262 is offset from the first reference point 260. In FIG. 2D, reference number 264d represents the difference (delta) in distance of movement of the stages 238, 240 at this time, e.g. the distance between the reference points 260, 262.

FIG. 2E illustrates the stage assembly 220 with the work piece 200 in a moved position 258C and movement of both stages 238, 240 being completed. In this embodiment, in the moved position 258C, the second reference point 262 is again centered on the first reference point 260 and both stages 238, 240 and the work piece 200 have been moved the same movement step 257.

Figure 3A:
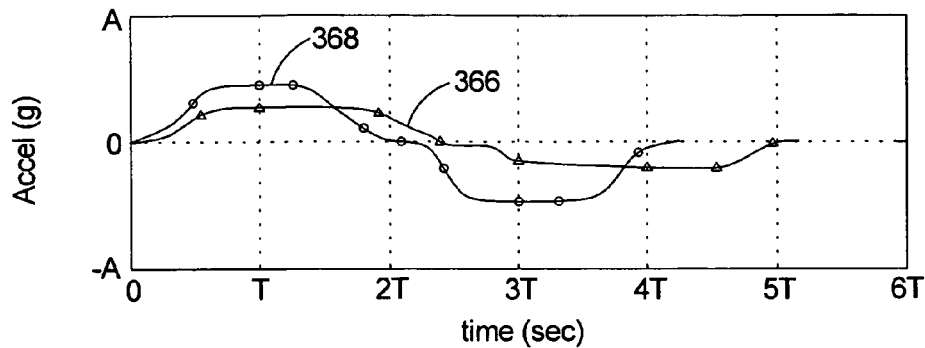
FIGS. 3A-3D are graphs that illustrate acceleration, velocity, position, and difference in position, respectively versus time during a first movement step.

FIGS. 3A-3D are graphs that illustrate the features of a first movement step. More specifically, FIG. 3A is a graph that illustrates a first acceleration profile 366 of the first stage that is moved with the first mover assembly and a second acceleration profile 368 of the second stage that is moved with the second mover assembly during movement of the work piece the first movement step versus time. In alternative, non-exclusive embodiments, in the Figures, A has a value of approximately 1, 2, 5, 7.5 or 10 g, and T has a value of approximately 0.01, 0.02, 0.03, 0.04, 0.05, 0.1, or 0.15 seconds.

Referring to FIG. 3A, in this embodiment, during the first movement step, the control system directs current to the mover assemblies so that (i) the first acceleration profile 366 is different from the second acceleration profile 368, (ii) acceleration of the stages begins at the same time, (iii) the second stage is initially accelerated at a greater rate than the first stage, (iv) the second stage has a higher peak acceleration than the first stage, (v) the second stage has a higher average acceleration than the first stage, (vi) acceleration of the second stage ends prior to the acceleration of the first stage, and (vii) acceleration of the first stage is greater than the acceleration of the second stage during a portion of the first movement step.

In this embodiment, (i) the second stage is moved with a peak acceleration of approximately 0.5A and an average acceleration of approximately 0.3A, and (ii) the first stage is moved with a peak acceleration of approximately 0.3A and an average acceleration of 0.2A.

Figure 3B:
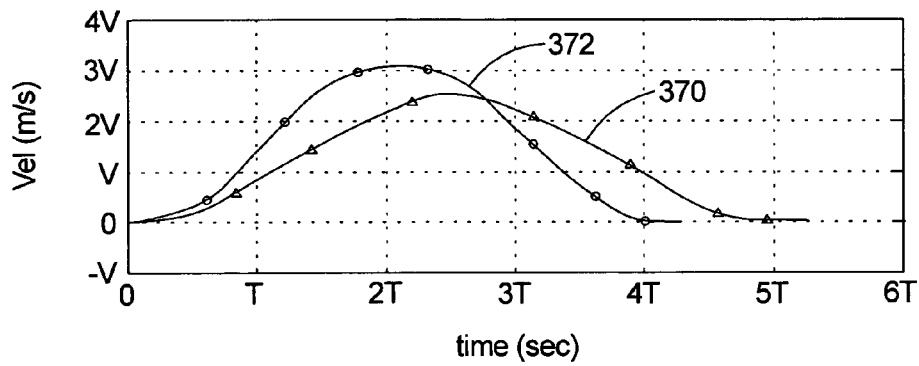

FIG. 3B is a graph that illustrates the resulting first velocity profile 370 of the first stage and the resulting second velocity profile 372 of the second stage during the first movement step versus time. In this embodiment, during the first movement step, (i) the first velocity profile 370 is different than the second velocity profile 370, (ii) the second stage reaches maximum velocity faster than the first stage, (iii) the second stage stops moving prior to the first stage, and (iv) the second stage has a higher peak velocity than the first stage. In alternative, non-exclusive embodiments, in the Figures, V can have a value of approximately 0.1, 0.2, 0.3, 0.4, 0.5, 1, or 2 m/s.

In this embodiment, (i) the second stage is moved with a peak velocity of approximately 3.1V, and (ii) the first stage is moved with a peak velocity of approximately 2.5V.

Figure 3C:
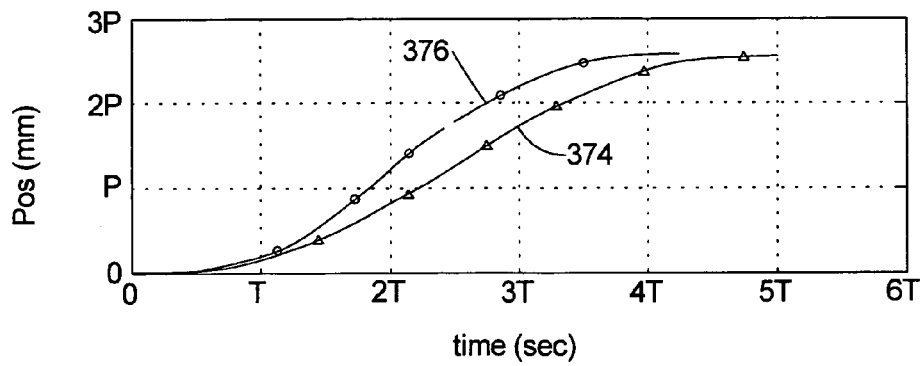

FIG. 3C is a graph that illustrates the resulting position of the first reference point 374 of the first stage and the resulting position of the second reference point 376 of the second stage versus time during the first movement step. During the first movement step, the second reference point 376 is moved ahead of the first reference point 374. Further, the second reference point 376 arrives at the end of the first movement step prior to the first reference point 374. In alternative, non-exclusive embodiments, in the Figures, P can have a value of approximately 1, 2, 5, 7.5, 10, 20 or 30 millimeters.

In this embodiment, each stage is moved approximately 2.6P during the first movement step. However, the second stage reaches the 2.6P movement step approximately 0.8T prior to the first stage.

Figure 3D:
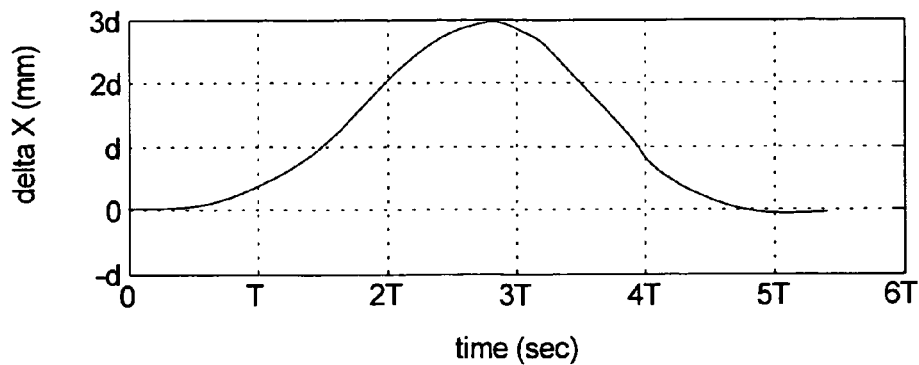

FIG. 3D is a graph that illustrates the resulting difference (delta) between the position of the first stage and the position of the second stage versus time during the first movement step. At the beginning and end of the first movement step, the delta is zero, and the delta is largest near the middle of the first movement step. In alternative, non-exclusive embodiments, in the Figures, d can have a value of approximately 0, 1, 2, 3, 4, 5, 7.5, or 10 millimeters.

In this embodiment, the stages are moved so that the largest delta is approximately equal 3d. It should be noted that delta can not exceed the maximum stroke of the second mover assembly.

Figure 4A:
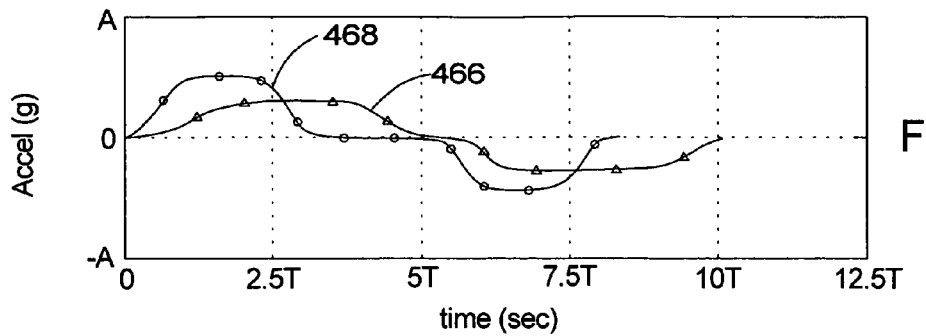
FIGS. 4A-4D are graphs that illustrate acceleration, velocity, position, and difference in position, respectively versus time during a second movement step.

FIGS. 4A-4D are graphs that illustrate the features of a second movement step which is larger than the first movement step. More specifically, FIG. 4A is a graph that illustrates a first acceleration profile 466 of the first stage and a second acceleration profile 468 of the second stage during movement of the work piece the second movement step versus time. In this embodiment, during the second movement step, the control system again directs current to the mover assemblies so (i) the second stage is moved with a peak acceleration of approximately 0.5A and an average acceleration of approximately 0.3A, and (ii) the first stage is moved with a peak acceleration of approximately 0.3A and an average acceleration of 0.2A.

Figure 4B:
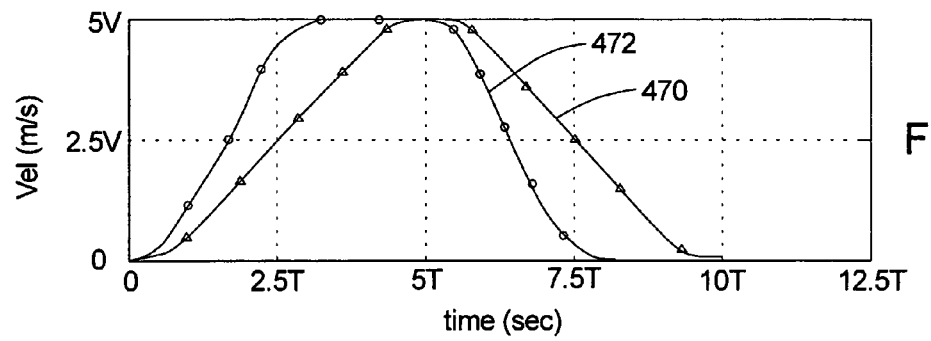

FIG. 4B is a graph that illustrates the resulting first velocity profile 470 of the first stage and the resulting second velocity profile 472 of the second stage during the second movement step versus time. In this embodiment, both stages are moved with a peak velocity of approximately 5V.

Figure 4C:
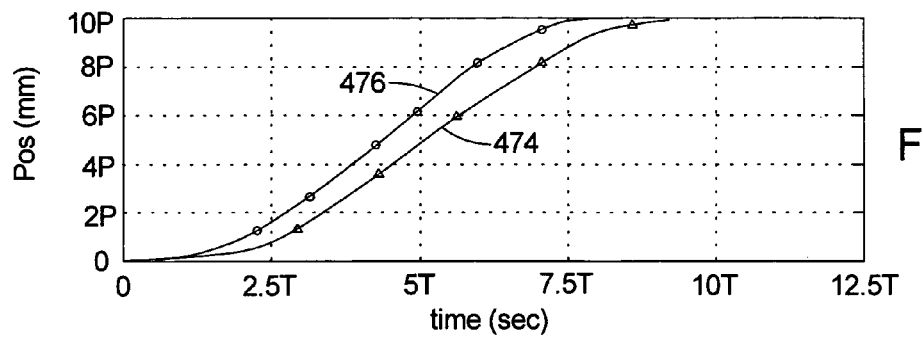

FIG. 4C is a graph that illustrates the resulting position of the first reference point 474, and the resulting position of the second reference point 476 versus time during the second movement step. During the second movement step, each stage is moved approximately 10P and the second stage is reaches the 10P movement step prior to the first stage.

Figure 4D:
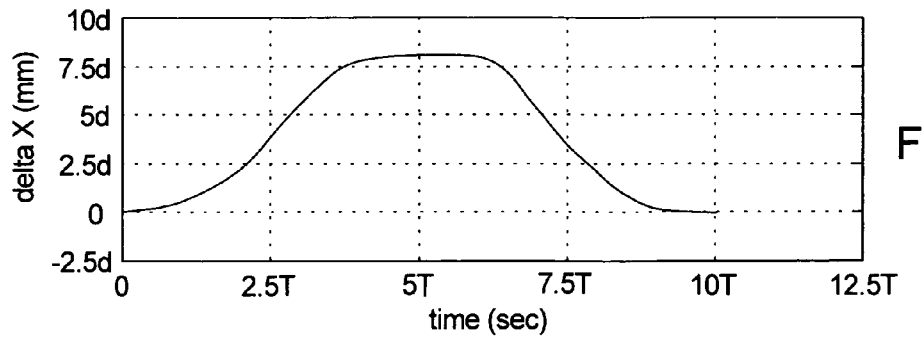

FIG. 4D is a graph that illustrates the resulting difference (delta) between the position of the first stage and the position of the second stage versus time during the second movement step. In this embodiment, the stages are moved so that the largest delta is approximately equal 8.5d.

Figure 5A:
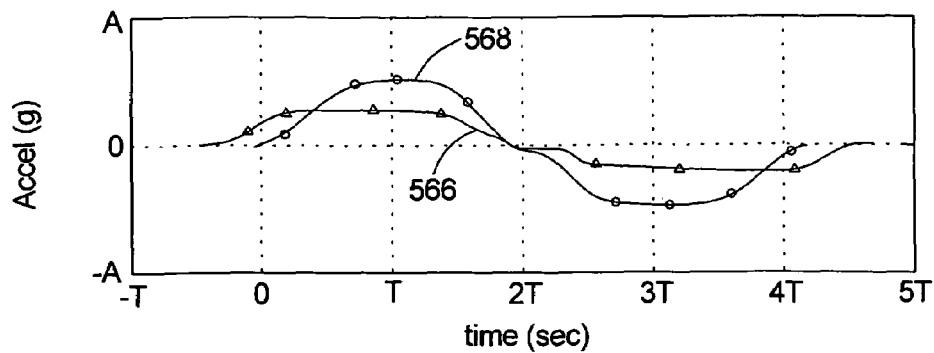
FIGS. 5A-5D are graphs that illustrate acceleration, velocity, position, and difference in position, respectively versus time during a third movement step.

FIGS. 5A-5D are graphs that illustrate the features of a third movement step that is similar in size to the first movement step. More specifically, FIG. 5A is a graph that illustrates a first acceleration profile 566 of the first stage and a second acceleration profile 568 of the second stage during movement of the work piece the third movement step versus time. In this embodiment, during the third movement step, the control system again directs current to the mover assemblies so (i) the second stage is moved with a peak acceleration of approximately 0.5A and an average acceleration of approximately 0.3A, and (ii) the first stage is moved with a peak acceleration of approximately 0.3A and an average acceleration of 0.2A.

However, during the third movement step, the control system directs current to the mover assemblies so that acceleration of the first stage occurs prior to the acceleration of the second stage. Stated another way, the control system directs current to the first mover assembly to begin moving the first stage prior to directing current to the second mover assembly to begin moving the second stage. In FIG. 5A, acceleration of the first stage begins approximately 0.5T prior to the acceleration of the second stage.

Figure 5B:
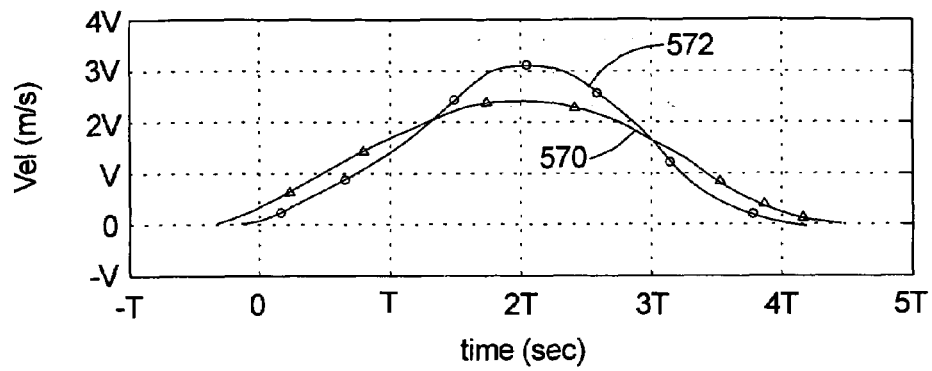

FIG. 5B is a graph that illustrates the resulting first velocity profile 570 of the first stage and the resulting second velocity profile 572 of the second stage during the second movement step versus time. In this embodiment, the second stage reaches a peak velocity of approximately 3.1V and the first stage reaches a peak velocity of approximately 2.6V.

Figure 5C:
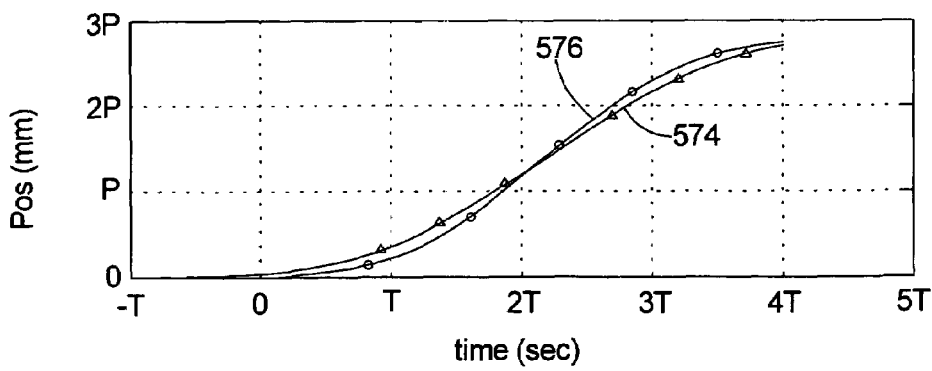

FIG. 5C is a graph that illustrates the resulting position of the first reference point 574, and the resulting position of the second reference point 576 versus time during the third movement step. During the third movement step, each stage is moved approximately 2.6P and the second stage is reaches the 2.6P movement step slightly ahead of the first stage.

Figure 5D:
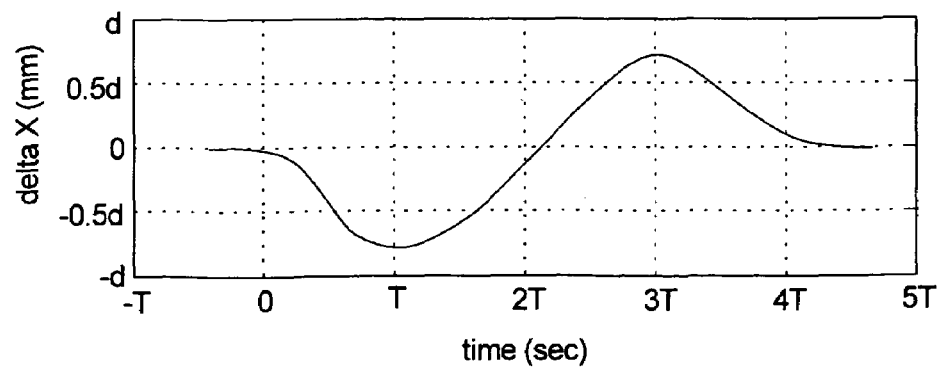

FIG. 5D is a graph that illustrates the resulting difference (delta) between the position of the first stage and the position of the second stage versus time during the third movement step. In this embodiment, the stages are moved so that the largest delta is approximately equal 0.75d. Because movement of the first stage starts prior to movement of the second stage, the first stage is initially leading the second stage. It should be noted from a comparison of FIGS. 3D and 5D, because the movement of the first stage begins prior to movement of the second stage, the resulting difference (delta) is much smaller. Alternatively, starting the movement of the first stage prior to the movement of the second stage can allow for even lower accelerations of the first stage while keeping the same delta as shown in FIG. 3D.

Figure 6A:
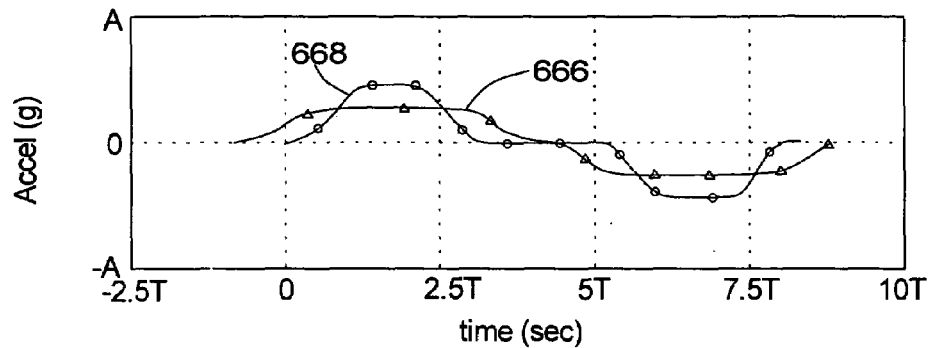
FIGS. 6A-6D are graphs that illustrate acceleration, velocity, position, and difference in position, respectively versus time during a fourth movement step.

FIGS. 6A-6D are graphs that illustrate the features of a fourth movement step that is similar in size to the second movement step. More specifically, FIG. 6A is a graph that illustrates a first acceleration profile 666 of the first stage and a second acceleration profile 668 of the second stage during movement of the work piece the fourth movement step versus time. In this embodiment, during the fourth movement step, the control system again directs current to the mover assemblies so (i) the second stage is moved with a peak acceleration of approximately 0.5A and an average acceleration of approximately 0.3A, and (ii) the first stage is moved with a peak acceleration of approximately 0.3A and an average acceleration of 0.2A. Again, during the fourth movement step, the control system directs current to the mover assemblies so that acceleration of the first stage occurs prior to the acceleration of the second stage.

Figure 6B:
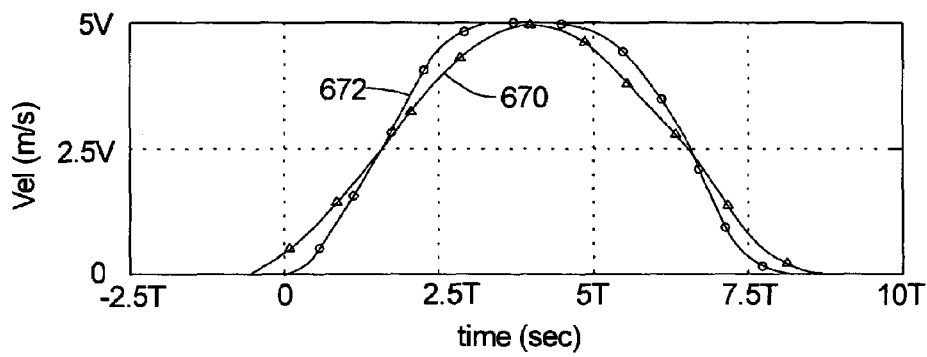

FIG. 6B is a graph that illustrates the resulting first velocity profile 670 of the first stage and the resulting second velocity profile 672 of the second stage during the second movement step versus time. In this embodiment, the stages reach a peak velocity of approximately 5V.

Figure 6C:
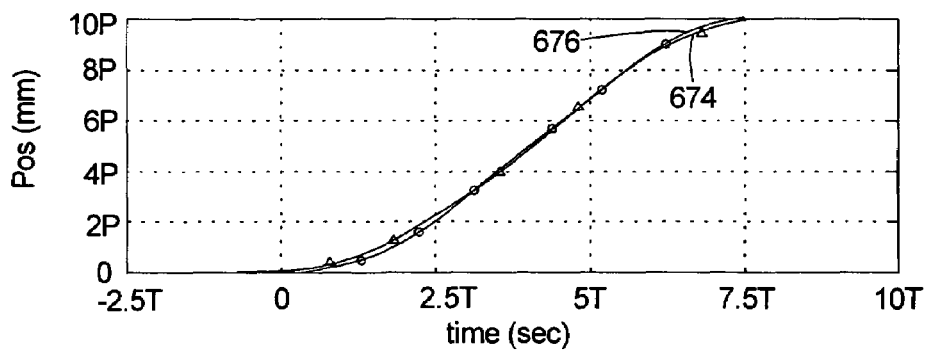

FIG. 6C is a graph that illustrates the resulting position of the first reference point 674, and the resulting position of the second reference point 676 versus time during the fourth movement step. During the fourth movement step, each stage is moved approximately 10P and the second stage is reaches the 10P movement step slightly ahead of the first stage.

Figure 6D:
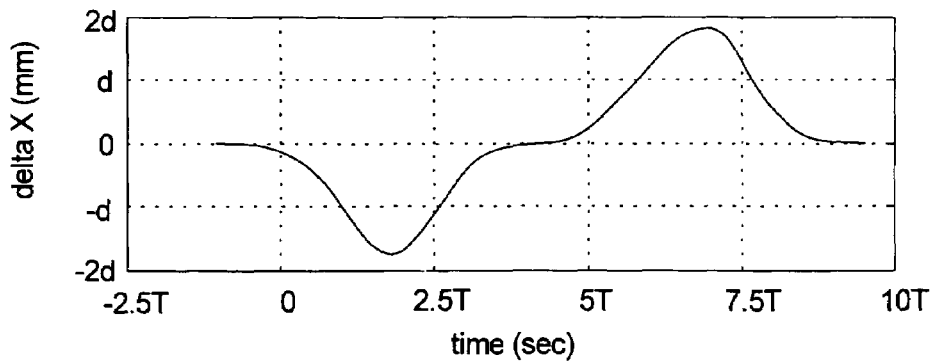

FIG. 6D is a graph that illustrates the resulting difference (delta) between the position of the first stage and the position of the second stage versus time during the fourth movement step. In this embodiment, the stages are moved so that the largest delta is approximately equal to 1.75d. Because movement of the first stage occurs prior to movement of the second stage, the first stage is initially leading the second stage. It should be noted from a comparison of FIGS. 4D and 6D, because the movement of the first stage begins prior to movement of the second stage, the resulting difference (delta) is much smaller.

Referring to FIGS. 3A-6D, during the movement steps, the control system is directing current to the mover assemblies so that the second stage is moving faster than the first stage near the maximum stroke of the second mover assembly. Further, starting the movement of stages at different times reduces the delta during the movement. The amount of time in which the movement of the first stage begins before movement of the second stage can vary. In alternative, non-exclusive embodiments, movement of the first stage begins approximately 0.005, 0.01, 0.05, 0.075, 0.1, 0.15, 0.2, 0.3, 0.5, 0.7 or 1 second prior to movement of the second stage.

Further, in alternative, non-exclusive embodiments, during a movement step, the mover assemblies move the stages so that the second stage stops at least approximately 0.005, 0.01, 0.05, 0.075, 0.1, 0.15, 0.2, 0.3, 0.5, 0.7 or 1 second before the first stage. Moreover, in alternative, non-exclusive embodiments, during a portion of the movement step, the mover assemblies move the stages so that the delta is approximately 0.1, 1, 2, 5, 10, 15 or 20 millimeters.

The differences in peak accelerations of the stages during the movement step can vary. In alternative, non-exclusive embodiments, during a movement step, the mover assemblies move the stages so that the second stage has a peak acceleration that is at least approximately 10, 20, 30, 40, 50, 100, 150, or 200 percent greater than a peak acceleration of the first stage. Stated in another fashion, in alternative, non-exclusive embodiments, the mover assemblies move the stages so that the second stage has an average acceleration that is at least approximately 10, 20, 30, 40, 50, 100, 150, or 200 percent greater than an average acceleration of the first stage.

In certain designs, throughput of the stage assembly is unchanged, even though the first stage is not accelerated as fast as the second stage. Further, because of the lower accelerations of the first stage, reaction forces generated by the first mover assembly is reduced, and/or heat generated by the first mover assembly is reduced when compared to a stage assembly in which both stages are accelerated at the same rate.

Figure 7A:
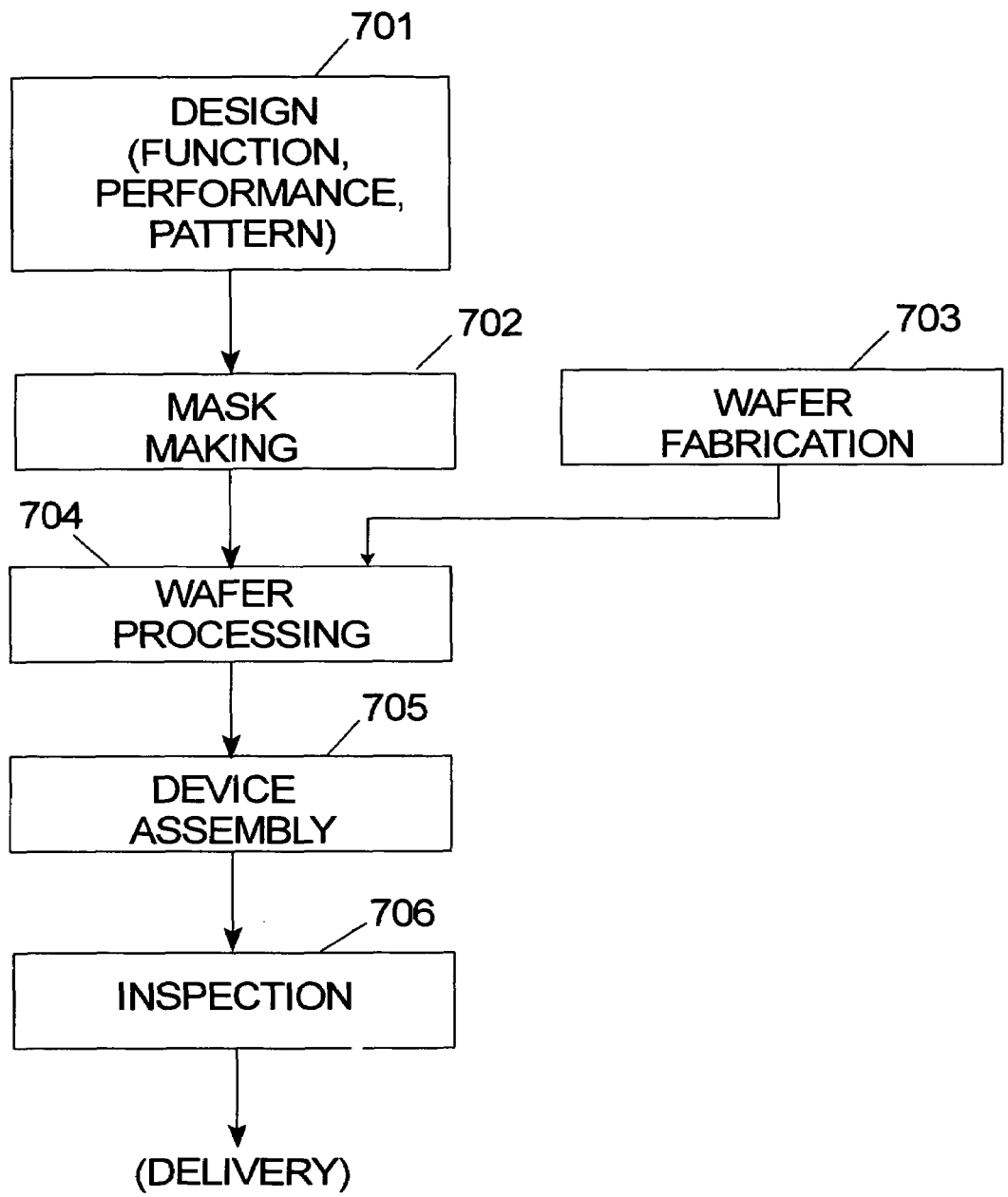
FIG. 7A is a flow chart that outlines a process for manufacturing a device in accordance with the present invention.

Semiconductor devices can be fabricated using the above described systems, by the process shown generally in FIG. 7A. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705, the semiconductor device is assembled (including the dicing process, bonding process and packaging process), finally, the device is then inspected in step 706.

Figure 7B:
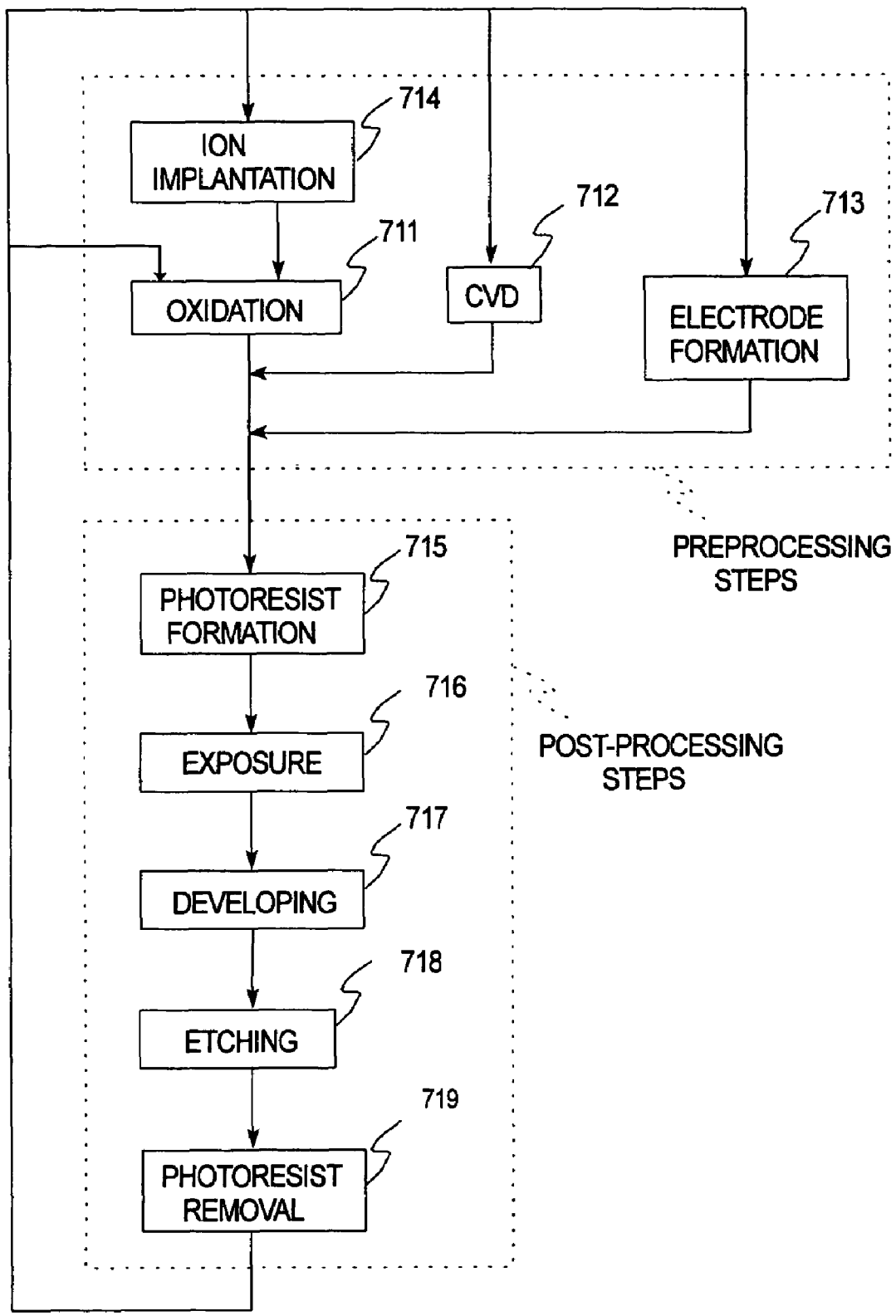
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed. Multiple circuit patterns are formed by repetition of these preprocessing and post-processing steps.

While the particular stage control method as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a work piece a movement step along a first axis, the stage assembly comprising:
   a first stage;
   a first mover assembly that moves the first stage with a first acceleration profile during the movement step;
   a second stage that retains the work piece;
   a second mover assembly that includes a first mover component that is coupled to the first stage and a second mover component that is coupled to the second stage, the second mover component interacting with the first mover component to move the second stage with a second acceleration profile during the movement step that is different than the first acceleration profile; and a control system that controls the first mover assembly based on the first acceleration profile and controls the second mover assembly based on the second acceleration profile, wherein the first acceleration profile has an earlier acceleration initiating point than the second acceleration profile.

2. An exposure apparatus including the stage assembly of claim 1.

3. The stage assembly of claim 1 wherein a maximum acceleration of the second acceleration profile is higher than a maximum acceleration of the first acceleration profile.

4. The stage assembly of claim 1 wherein an average acceleration of the second acceleration profile is higher than an average acceleration of the first acceleration profile.

5. The stage assembly of claim 1 wherein the second acceleration profile has an earlier deceleration stopping point than the first acceleration profile.

6. The stage assembly of claim 1 wherein the first acceleration profile has a later deceleration initiating point than the second acceleration profile.

7. The stage assembly of claim 1 wherein the acceleration initiating point of the first acceleration profile is approximately 10 milliseconds earlier than the acceleration initiating point of the second acceleration profile.

8. The stage assembly of claim 1 wherein a traveling distance of the first stage during the movement step following the first acceleration profile is approximately equal to a traveling distance of the second stage during the movement step following the second acceleration profile.

9. The stage assembly of claim 8 wherein a relative movement range between the first stage and the second stage during the movement step along the first axis is at least approximately 0.3 millimeters.

10. A stage assembly that moves a work piece a movement step along a first axis, the stage assembly comprising:
    a first stage;
    a first mover assembly that moves the first stage with a first average acceleration during the movement step;
    a second stage that retains the work piece;
    a second mover assembly that includes a first mover component that is coupled to the first stage and a second mover component that is coupled to the second stage, the second mover component interacting with the first mover component to move the second stage with a second average acceleration during the movement step that is different than the first average acceleration; and
    a control system that controls the first mover assembly and the second mover assembly so that the first stage initiates movement before the second stage during the movement step.

11. The stage assembly of claim 10 wherein the control system controls the first mover assembly and the second mover assembly so that the second stage moves with a higher maximum acceleration than the first stage during the movement step.

12. The stage assembly of claim 10 wherein the control system controls the first mover assembly and the second mover assembly so that the second stage stops moving before the first stage during the movement step.

13. The stage assembly of claim 10 wherein the control system controls the first mover assembly and the second mover assembly so that the first stage initiates movement at least approximately 10 milliseconds before the second stage during the movement step.

14. An exposure apparatus including the stage assembly of claim 10.

15. The stage assembly of claim 10 wherein the control system control the first mover assembly and the second mover assembly so that a traveling distance of the first stage during the movement step is approximately equal to a traveling distance of the second stage during the movement step.

16. The stage assembly of claim 15 wherein a relative movement range between the first stage and the second stage during the movement step along the first axis is at least approximately 0.3 millimeters.

17. A method for moving a work piece a movement step, the method comprising the steps of:
    providing a first stage;
    moving the first stage the movement step with a first mover assembly;
    retaining the work piece with a second stage; and
    moving the second stage with a second mover assembly, the second mover assembly including a first mover component that is coupled to the first stage and a second mover component that is coupled to the second stage, the second mover component interacting with the first mover component to move the second stage during the movement step, wherein the step of moving the first stage begins before the step of moving the second stage.

18. The method of claim 17 wherein the second mover assembly moves the second stage during the movement step with a higher maximum acceleration than the first mover assembly moves the first stage during the movement step.

19. The method of claim 17 wherein the second mover assembly moves the second stage during the movement step with a higher average acceleration than the first mover assembly moves the first stage during the movement step.

20. The method of claim 17 wherein the step of moving the first stage ends after the step of moving the second stage ends.

21. A method for making an exposure apparatus comprising the steps of providing an illumination source, providing a work piece, and moving the work piece by the method of claim 17.

22. A method of making a wafer including the steps of providing a substrate and forming an image on the substrate with the exposure apparatus made by the method of claim 21.

23. A method for moving a first stage and a second stage during a movement step, with the second stage being movable relative to the first stage during the movement step, the method comprising the steps of:
    initiating movement of the first stage;
    initiating movement of the second stage after initiating movement of the first stage;
    stopping movement of the first stage; and
    stopping movement of the second stage, wherein a travel distance of the first stage during the movement step is approximately equal to a travel distance of the second stage during the movement step.

24. The method of claim 23 wherein the first stage stops movement after the second stage stops movement.

25. The method of claim 23 wherein a maximum acceleration of the second stage during the movement step is higher than a maximum acceleration of the first stage during the movement step.

26. The method of claim 23 wherein a maximum velocity of the second stage during the movement step is higher than a maximum velocity of the first stage during the movement step.

27. The method of claim 23 further comprising the step of aligning a first reference point of the first stage and a second reference point of the second stage before initiating the movement step.

28. The method of claim 27 wherein a range of relative distance between the first reference point and the second reference point during the movement step is at least approximately 0.3 millimeters.

29. A stage assembly that moves a work piece a movement step along a first axis, the stage assembly comprising:
   a first stage;
   a first mover assembly that moves the first stage with a first peak velocity during the movement step;
   a second stage that retains the work piece;
   a second mover assembly that includes a first mover component that is coupled to the first stage and a second mover component that is coupled to the second stage, the second mover component interacting with the first mover component to move the second stage with a second peak velocity during the movement step; and
   a control system that controls the first mover assembly and the second mover assembly so that the second peak velocity is higher than the first peak velocity during the movement step.

30. The stage assembly of claim 29 wherein the control system controls the first mover assembly to move the first stage with a first acceleration profile during the movement step and controls the second mover assembly to move the second stage with a second acceleration profile during the movement step, and wherein the first acceleration profile is different than the second acceleration profile.

31. The stage assembly of claim 30 wherein a maximum acceleration of the second acceleration profile is higher than a maximum acceleration of the first acceleration profile.

32. The stage assembly of claim 30 wherein an average acceleration of the second acceleration profile is higher than an average acceleration of the first acceleration profile.

33. The stage assembly of claim 29 wherein the control system controls the first mover assembly and the second mover assembly so that the first mover assembly initiates movement of the first stage at the same time that the second mover assembly initiates movement of the second stage during the movement step.

34. The stage assembly of claim 29 wherein the control system controls the first mover assembly and the second mover assembly so that the second mover assembly stops movement of the second stage before the first mover assembly stops movement of the first stage during the movement step.

35. The stage assembly of claim 29 wherein the control system controls the first mover assembly and the second mover assembly so that the first mover assembly initiates movement of the first stage before the second mover assembly initiates movement of the second stage during the movement step.

* * * * *